US00RE37580E

(19) United States
(12) Reissued Patent
Barnes et al.

(10) Patent Number: US RE37,580 E
(45) **Date of Reissued Patent: *Mar. 12, 2002**

(54) GUARD RING ELECTROSTATIC CHUCK

(75) Inventors: Michael Scott Barnes, San Francisco, CA (US); John Howard Keller, Newburgh, NY (US); Joseph S. Logan, Jamestown, RI (US); Robert E. Tompkins, Pleasant Valley; Robert Peter Westerfield, Jr., Montgomery, both of NY (US)

(73) Assignee: Dorsey Gage Co., Inc., Poughkeepsie, NY (US)

( * ) Notice: This patent is subject to a terminal disclaimer.

(21) Appl. No.: 09/272,408

(22) Filed: Mar. 18, 1999

Related U.S. Patent Documents

Reissue of:
(64) Patent No.: 5,612,851
Issued: Mar. 18, 1997
Appl. No.: 08/471,105
Filed: Jun. 6, 1995

U.S. Applications:

(63) Continuation of application No. 08/169,932, filed on Dec. 20, 1993, now Pat. No. 5,463,525.

(51) Int. Cl.[7] ..... H02N 13/00
(52) U.S. Cl. ..... 361/234
(58) Field of Search ..... 361/230–234

(56) References Cited

U.S. PATENT DOCUMENTS

| | | | | | |
|---|---|---|---|---|---|
| 5,400,209 | A | * | 3/1995 | Moslehi | 361/234 |
| 5,436,790 | A | * | 7/1995 | Blake et al. | 361/234 |
| 5,444,597 | A | * | 8/1995 | Blake et al. | 361/234 |
| 5,463,525 | A | * | 10/1995 | Barnes et al. | 361/234 |
| 5,467,249 | A | * | 11/1995 | Barnes et al. | 361/234 |
| 5,535,507 | A | * | 7/1996 | Barnes et al. | 29/825 |
| 5,561,585 | A | * | 10/1996 | Barnes et al. | 361/234 |

* cited by examiner

*Primary Examiner*—Michael J. Sherry
(74) *Attorney, Agent, or Firm*—Eric W. Petraske

(57) ABSTRACT

An electrostatic chuck is disclosed that is resistant to the formation of vacuum arcs between the back of the wafer being processed and the body of the chuck. A guard ring surrounds the chuck and floats close to the self-bias potential induced by the plasma on the wafer. The voltage between the wafer and the closest electrode is thereby capacitively divided by the guard ring.

10 Claims, 5 Drawing Sheets

GUARD RING ELECTROSTATIC CHUCK

Matter enclosed in heavy brackets [ ] appears in the original patent but forms no part of this reissue specification; matter printed in italics indicates the additions made by reissue.

CROSS-REFERENCE TO RELATED PATENT APPLICATION

This patent application is a continuation of U.S. patent application Ser. No. 08/169,932, which was filed on Dec. 20, 1993, and which issued on Oct. 31, 1995 as U.S. Pat. No. 5,463,525.

TECHNICAL FIELD

The field of the invention is that of electrostatic chucks for holding a workpiece by electrostatic attraction between the workpiece and one or more electrodes in the chuck.

BACKGROUND ART

Extensive work has been done in electrostatic chucks within the last ten years. An example is the chuck illustrated in U.S. Pat. No. 5,055,964, issued to the International Business Machines Corporation.

A chuck adapted to avoid a problem in the prior art of excessive retention of clamping force after power is removed is illustrated in U.S. Pat. No. 5,103,367. That chuck uses an alternating current to avoid polarization of the dielectric.

SUMMARY OF THE INVENTION

The invention relates to an electrostatic chuck that suppresses the formation of vacuum arcs between the back of the wafer being processed and the body of the chuck by the interposition of a conductive guard ring that floats close to the self-bias potential induced by the plasma on the wafer, thereby defining an equipotential area between the closest electrode and the wafer and capacitively dividing the voltage between the wafer and the closest electrode.

BEST MODE FOR CARRYING OUT THE INVENTION

Figure 1:
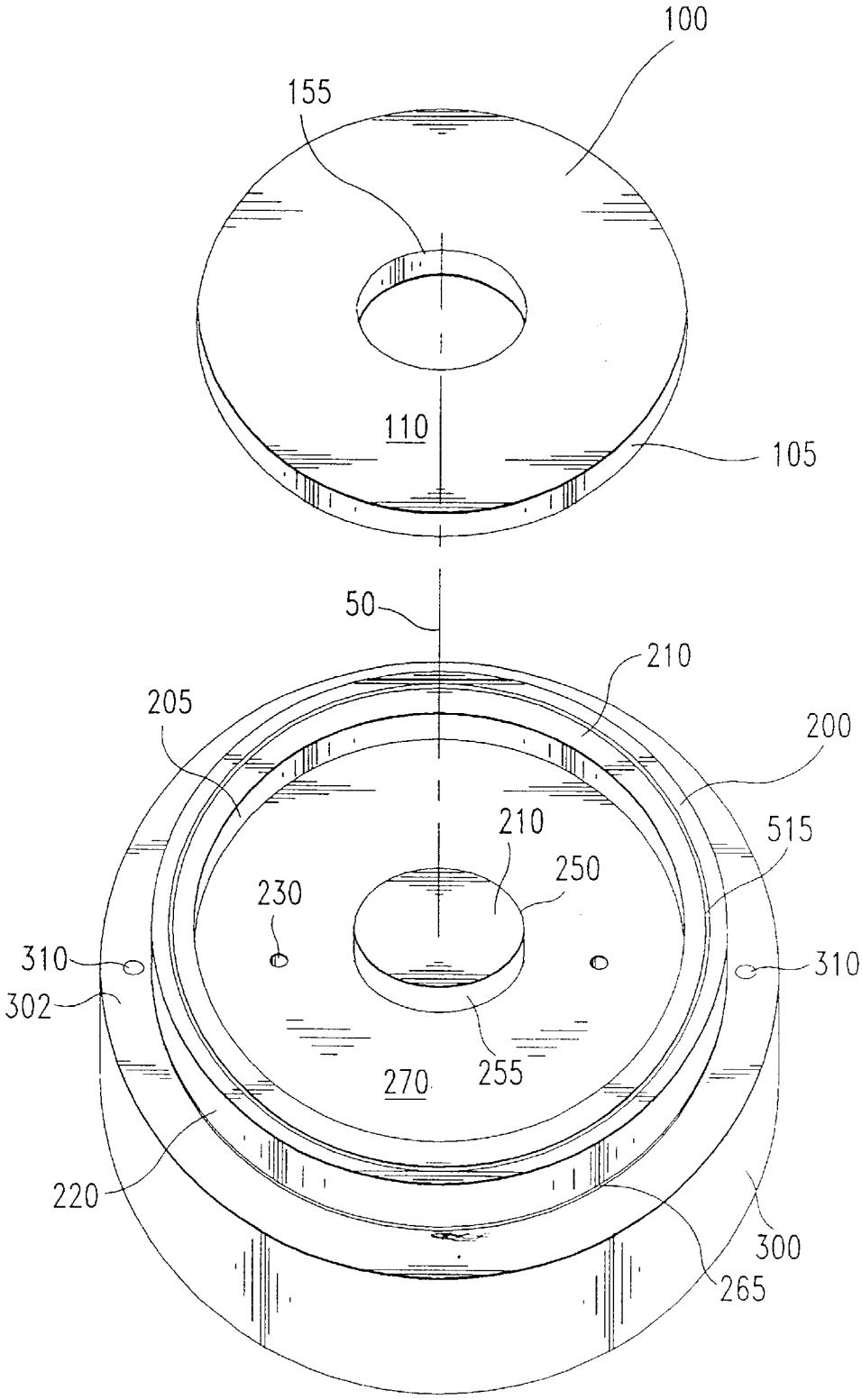
FIG. 1 illustrates in perspective an embodiment of the invention.

Referring now to FIG. 1, there is shown in exploded view, a bipolar or split electrode electrostatic chuck, in which base electrode 200, the larger portion of the chuck, has an electrode recess 270 machined in it to hold second electrode, or ring electrode, 100, ring electrode 100 being displaced along axis 50 in order to illustrate the chuck with greater clarity. Electrode 200 has a raised center hub 250 that defines, together with rim 220 of base electrode 200 a top surface 210. As is known in the art, bipolar chucks attract semiconductor wafers or other workpieces to surface 210 by electrostatic attraction of induced charges on the lower surface of the workpiece and fringing fields extending up to the workpiece from the capacitor formed by electrodes 100 and 200.

It can be seen that ring electrode 100 has an inner vertical surface 155 that will have an inner recess gap between it and corresponding vertical surface 255 of center hub 250 after assembly. There is a corresponding pair of outer surfaces 105 and 205 that define a second outer recess gap. It is important, to provide consistency in clamping force, that these gaps be defined precisely and that they be repeatable. At the bottom of recess 270 there are illustrated two apertures 230 that are used to permit the passage of lifting pins to raise ring electrode 100 up so that top surface 110 is coplanar with surface 210 of base electrode 200. The initial thickness of electrode 100 is made to allow a coupling gap between the bottom of recess 270 (the oxidized recess depth) and the bottom of electrode 100 (i.e. allowing for an oxidized thickness of electrode 100) of nominal thickness 0.001" to 0.003", typically 0.002".

The main requirement of the insulation, whether it be hard-coat anodization, alumina, or any other insulator, is that the coating be as non-porous as possible, so that the electrical breakdown voltage of the insulator is as high as possible. The higher the breakdown voltage the smaller the gaps between the electrodes can be. Preferably, the breakdown strength should be at least 500 volts per mil. Insulators are preferably applied to produce a final thickness of 0.002 inch. Porosity is also important in this application. If the plasma can penetrate through the pores and contact an electrode, then there can be either an arc through the plasma or the electrode can be brought to the plasma potential, thereby declamping that electrode.

Groove 515 extends around the outer portion of electrode 200 in top surface 210 to feed and distribute a gas such as helium into the interstices between the top surface of the electrodes and the back of the wafer for the purpose of providing greater heat transfer than would be provided by mechanical contact between the two surfaces. Those skilled in the art will appreciate that the mechanism used herein to maintain the pressure between the chuck and the wafer at a nominal value (10 Torr, say) that is much greater than the nominal pressure of the chamber (order of magnitude 0.5 mTorr–2 Torr) is that of flowing gas outwardly through the impedance of the short path between rim passage 515 and the ambient vacuum. Pressure within passage 515 is equal to the "impedance" of the constricted passages between the wafer and base electrode 200 times the flow, in analogy to Ohm's law. Thus, it can be seen that, given the impedance set by the roughness of the surfaces and the attractive force between the chuck and wafer 600, it is essential to flow a predetermined amount of gas sufficient to maintain the pressure in the desired range.

Figure 5:
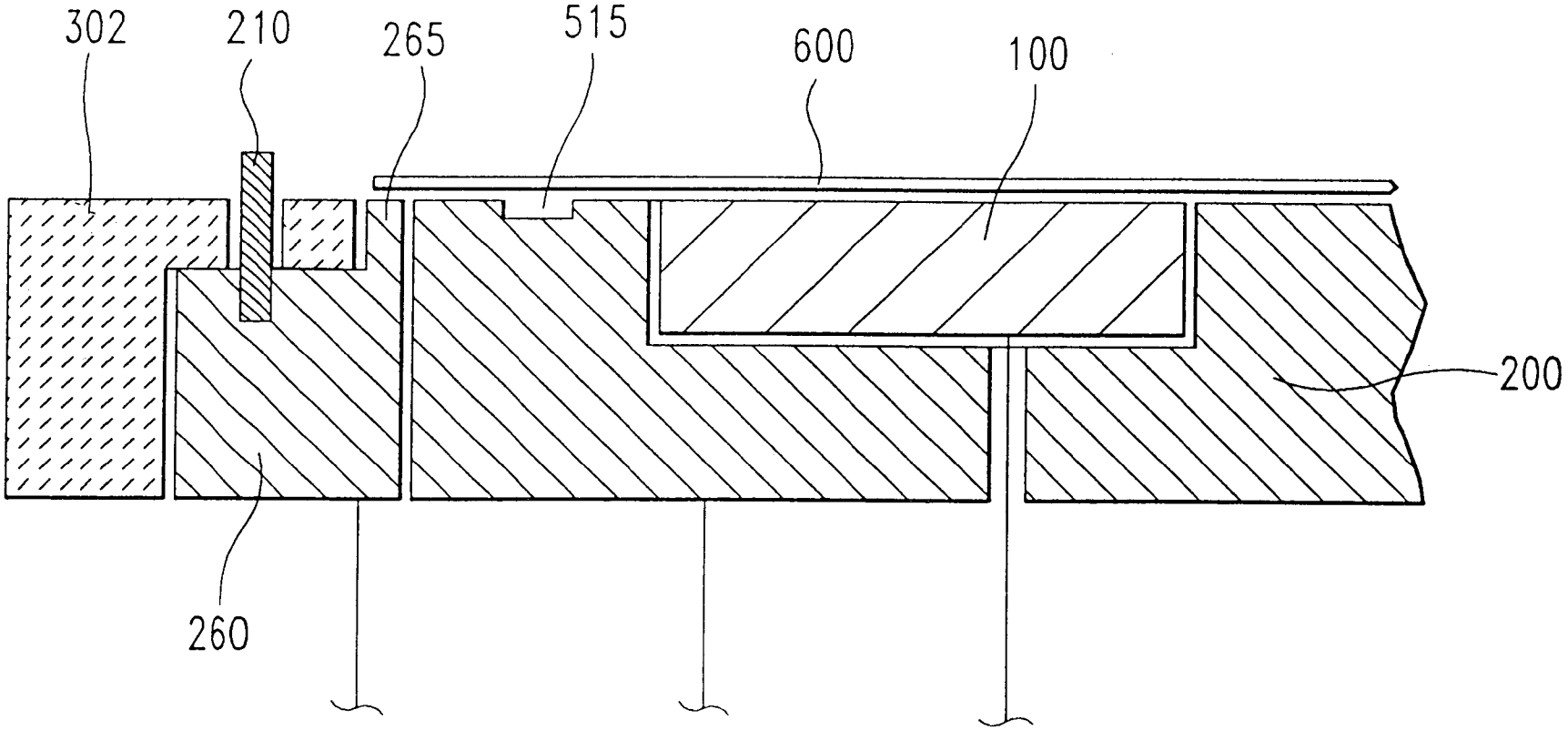
FIGS. 5 and 6 illustrate in cross section alternative embodiments of the invention.

Guard ring 300, shown as displaced downwardly, has, as shown in detail in FIG. 5, a thin conductive member 265 that will have its top surface coplanar with top surface 210 of the gripping electrodes. It also has an annular shaping ring 302 that serves to shape the fringing RF fields passing from the chuck into the plasma radially outside the workpiece.

Figure 2:
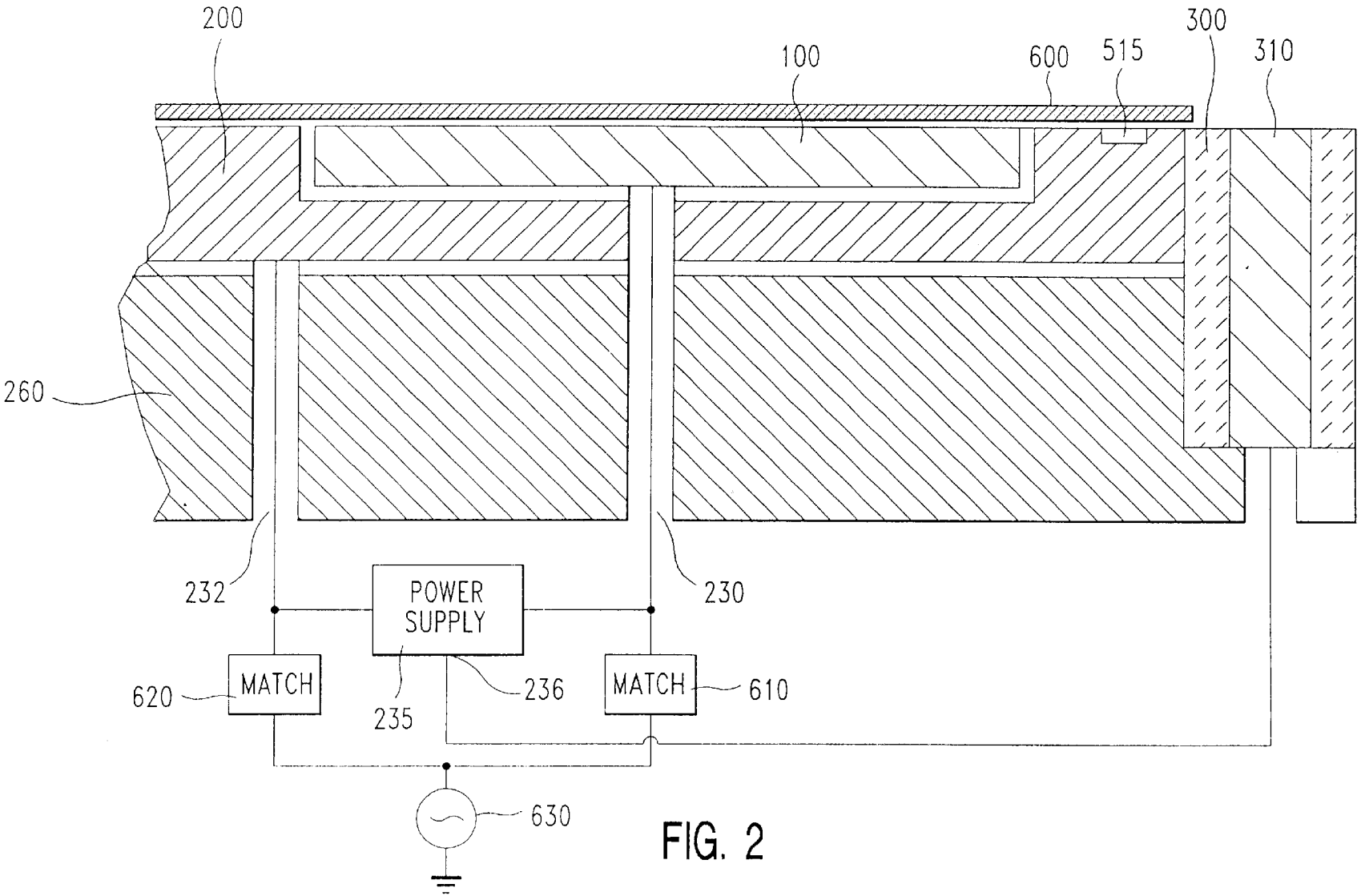
FIG. 2 illustrates in cross section a portion of the embodiment of FIG. 1.

Referring now to FIG. 2, there is shown in partially pictorial, partially schematic form a cross section of a portion of a chuck in which electrodes 100 and 200 of the chuck are enclosed in a floating base 260. Since the chuck is symmetric, only one side is illustrated. Base 260 is isolated from electrode 200 and floats by capacitive coupling to a potential $V_{base}$ that is close to the wafer potential. Wafer 600 is in contact with the plasma and therefore is at a time average "self-bias" potential $V_{sb}$ that is well below the plasma potential $V_p$. The exact voltage of the base will depend on the geometric details of the particular apparatus. The time-average plasma potential is always the highest in the system in order to maintain the electron cloud within the plasma. The walls of the vacuum chamber are conventionally at ground, with the chuck at some intermediate voltage depending on the ratio of a wall capacitance between the plasma and the wall and a wafer capacitance between the plasma and the wafer. Since the chuck is much smaller than the wall, and the RF currents through the two capacitors must be equal, the voltage drop over the sheath between the plasma and the chuck must be very much greater than the voltage drop over the wall sheath. (In some chambers having a very symmetric structure such as the Lam Research model 4520, $V_{sb}$ may be approximately zero.) Thus, the time-average voltage on the wafer $V_{sb}$ (substantially equal for both the front and back surface) will typically be less than ground.

The two electrodes of the chuck will be biased at some potential above and below $V_{sb}$. The biasing may be done by preliminary tests or calculations to derive a bias value or by sensing the plasma voltage in real time and biasing the electrodes about that measured voltage.

Figure 3:
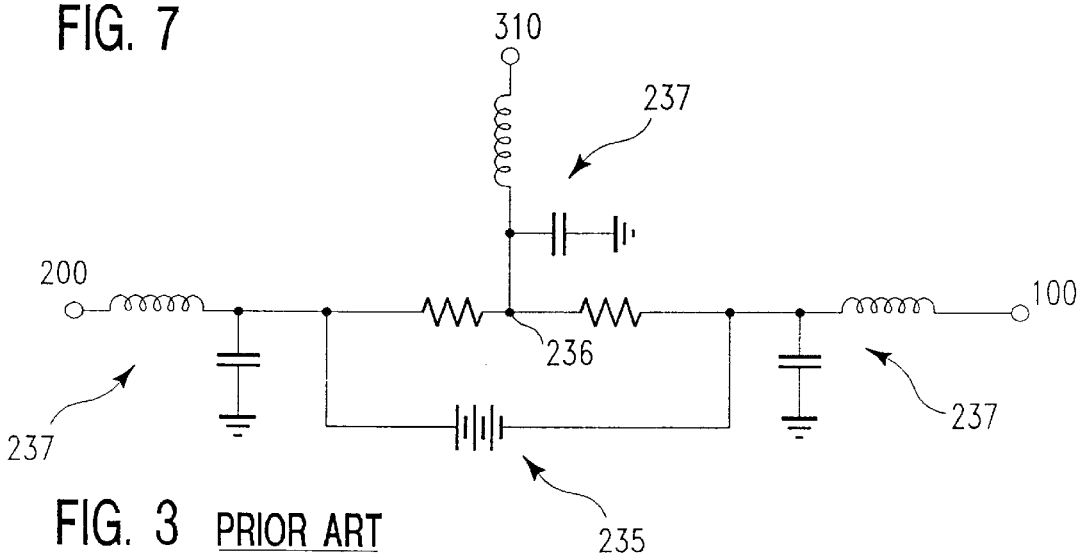
FIG. 3 PRIOR ART
FIG. 3 illustrates schematically an isolated power supply for use with the invention.

On the left of the figure are found electrical connections for both DC voltage and RF power. The DC voltage is a nominal 600 volts applied between electrodes 200 and 100 through apertures 232 and 230, respectively. The value can range broadly, depending on the application, from nearly zero to about 800 volts. The RF connection is a nominal 1000 watts at 13.56 MHz for a chuck diameter of 200 mm. The RF frequency and power will be determined by the manufacturer of the chamber in which the chuck will be mounted and will vary with the type of etching gas, the material being etched, the size of the wafer, and the size of the chamber. It is fed from generator 630 to two boxes labeled 610 and 620 which represent conventional impedance matching and power distribution subsystems that are connected to electrodes 200 and 100, respectively. A conventional DC power supply 235, isolated by low-pass filters 237 as shown in FIG. 3, supplies the DC bias. Those skilled in the art will readily appreciate that the RF power may be applied at various points to effect a balance between the power coupled to the plasma above electrode 200 and that coupled above electrode 100. For example, there may be a single feed to electrode 200 with capacitive coupling through gap 112 to electrode 100; there may be a direct connection to one of the electrodes with an impedance matching/power balancing system to the other electrode; or electrode 200 and/or 100 may be connected at a number of points. The feed may be used to compensate for the extra capacitance between base electrode 200 and electrode 100 and therefore to make the power coupled into the plasma equal for the two electrodes or there may be a deliberate imbalance to compensate for the effects of the chamber dimensions which may require a greater power feed in some areas to maintain uniformity of the etching.

In the preferred embodiment illustrated in FIG. 5, floating guard ring 265 is insulated by a thin dielectric coating (preferably the same alumina as that coating electrodes 100 and 200) from the plasma, from chuck electrode 200, and from wafer 600 and the energy stored in the plasma. It will be at some potential close to $V_{sb}$. In a typical system, the time-average plasma voltage may be +100 V, the corresponding wafer potential (the self-bias potential) may be −300 V, and the electrodes 100 and 200 may be at 0 V and −600 V.

Without guard ring 265, the vertical portion of base 260, there will be vacuum arcs (an arc discharge through the vacuum between electrode 200 and wafer 600 or the plasma) caused by the high fields at corner 202 of electrode 200 and corner 602 of wafer 600. The plasma is rich in electrons and the alumina insulation on electrode 200 is porous, so that electrons can penetrate through the pores to the surface of the aluminum electrode, facilitating the initiation of a discharge. Both thermionic emission and instantaneous electric field contribute to initiating arcs. The primary purpose of guard ring 265 is to prevent arcs between the back corner of wafer 600 and/or the plasma in the corner region and electrode 200 by establishing an intermediate area that will be equipotential about the circumference of the electrodes because the guard ring is conductive and therefore dropping the potential across a capacitance between electrode 200 and ring 265 (which is at or close to $V_{sb}$) and therefore both reducing the possibility that there will be a discharge and preventing the flow of electrons that would support an arc by physically blocking the path between the corners of the electrode and the surface.

In addition, ring 265 of base 260 is close in the vertical dimension to (nominally in contact with) the bottom of wafer 600, reducing the amount of plasma that may make contact with electrode 200 and thus prolonging the life of electrode 200. Since the heat transfer gas is flowing from passage 515 out into the vacuum through the confined space between ring 265 and wafer 600, those skilled in the art would expect that the gas would increase the danger of breakdown in that region, by providing a source of electrons and ions, as gases do in gas discharge apparatus.

There is a drawback to this arrangement in that RF coupling to the portion of wafer 600 above ring 265 is reduced compared to that above electrode 200 by the second capacitor that is introduced between electrode 200 and ring 265. Further, wafer 600 extends over the entire area of ring 265 and there is a deliberate overhang of wafer 600 above dielectric shaping ring 302 that reduces the RF power in that area still further. This overhang reduces the exposure of ring 265 to the plasma, but at the cost of reduced coupling. In a preferred embodiment, the width of guard ring 265 is 1–1.5 mm and the overhang of wafer 600 over shaping ring 302 is 2 mm. In addition, shaping ring 302 serves to shape the fringing RF fields passing into the plasma so that etching uniformity is improved at the rim of the wafer. Suitable materials for shaping ring 302 are alumina or quartz, the horizontal dimension of ring 302 being set to shape the field above the wafer by providing an offset from ground or other low potential, so that the electric field above the wafer remains perpendicular to the surface being etched. The thickness of ring 302 is set to reduce the coupling to the plasma above ring 302 relative to that above wafer 600 so that the plasma is only weakly energized in that area and ring 302 is etched only very slowly. The choice of materials is affected not only by corrosion resistance but also by non-interference of the reaction products that result from etching the ring during processing. There is a frequency-dependent coupling at the edge of the wafer caused by the frequency-dependent conductivity of the wafer. For typical lightly doped substrates having a dopant concentration of $10^{13}/cm^3$ the wafer has a very high RF conductivity at 400 Khz, a moderate conductivity at 13.5 MHz and a poor conductivity at 40 MHz.

Figure 4:
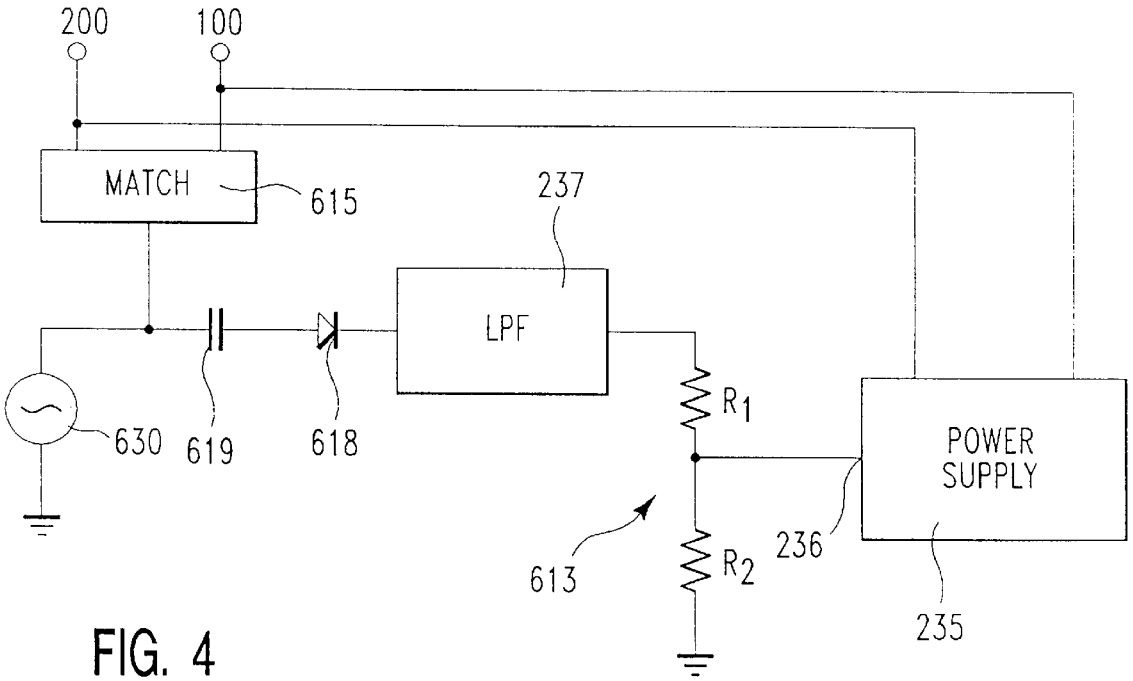
FIG. 4 illustrates a method of biasing the power supply of FIG. 3.

A method of controlling the bias is illustrated in FIG. 4, in which electrodes 100 and 200 are biased from DC supply 235, illustrated in FIG. 3, with the RF being fed from generator 630 through conventional matching network 615. A coupling capacitor 619 and diode 618 pass on a small amount of power for monitoring purposes through low pass filter 237 to resistor chain 613. A tap on the resistor chain feeds a reference to supply 235 and electrodes 100 and 200 are biased about that reference. The ratio of R1 and R2 in resistor chain 613 is set empirically during initial calibration to provide the desired bias, symmetric or asymmetric as the case may be.

FIG. 5 illustrates an embodiment of the invention in which sensing pin 262 is exposed to the plasma and also is in contact with base 260, so that base 260 is at the self bias potential. Sensing pin 262 may be made from a corrosion resistant material such as graphite, doped Si or SiC, depending on the chemistry of the plasma. Pin 262 need not be a good conductor, since it only passes on the plasma potential and draws very little current. Any convenient number of pins 262 may be used. DC and RF power connections are made as in FIG. 2.

Figure 6:
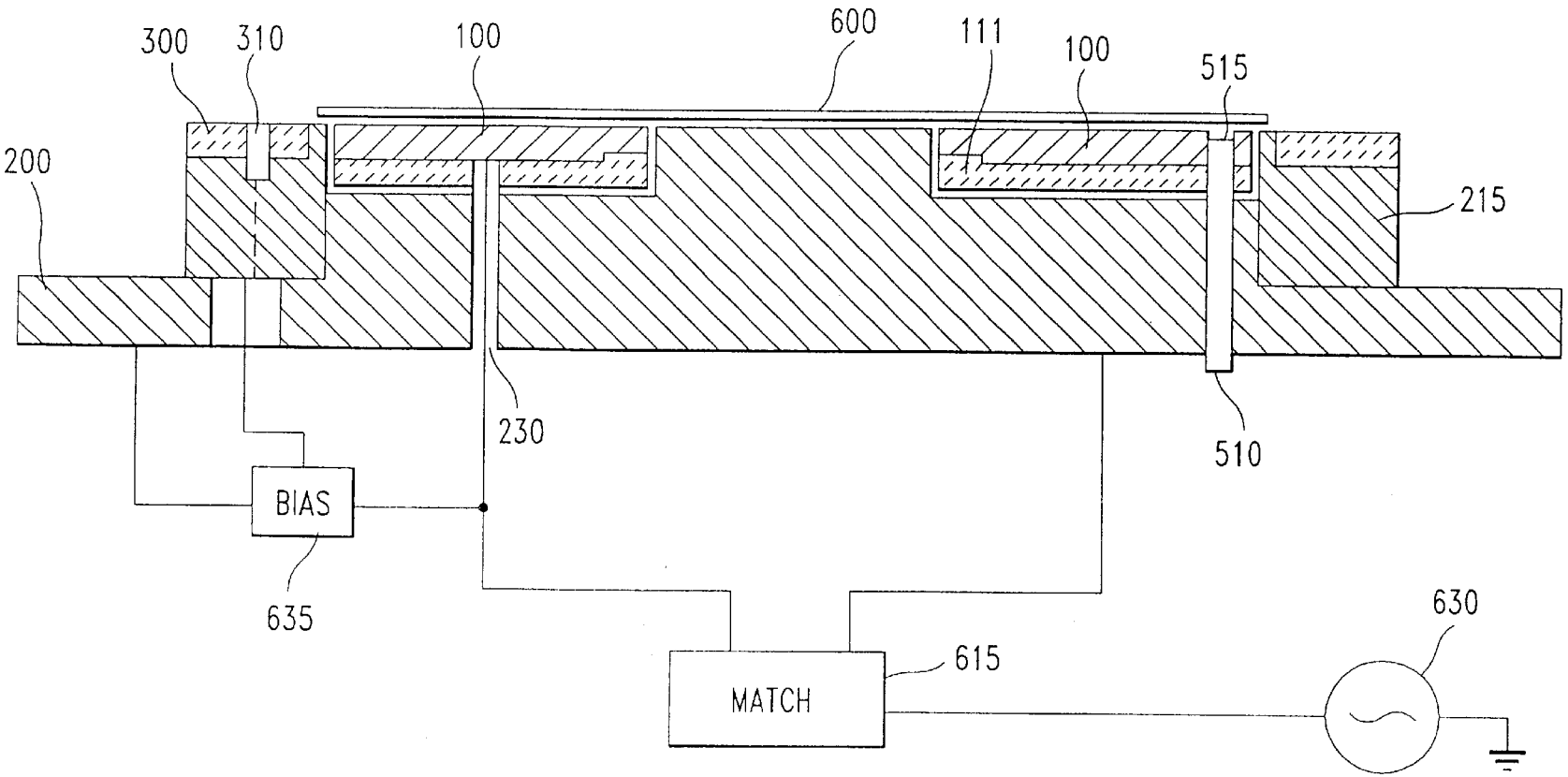

Referring now to FIG. 6, there is shown an alternative embodiment of the invention in which electrodes 100 and 200 are biased about $V_{sb}$. On the right of FIG. 6, a dielectric ring 300 has one or more holes in it for the passage of a conductive element 310 that is in contact with the plasma. Preferably, element 310 is made from a corrosion resistant material such as graphite, doped Si or SiC, depending on the chemistry of the plasma. Element 310 need not be a good conductor, since it only passes on $V_{sb}$ and draws very little current. The material of ring 300 may be alumina, quartz or any other durable dielectric. Bias source 235 is referenced to bias electrodes 100 and 200 symmetrically with respect to the $V_{sb}$. In an example, the plasma voltage is +100 V, the self-bias voltage on wafer 600 is −300 V and the voltage between electrodes 100 and 200 is 600 V, the voltage on electrodes 100 and 200 will be 0 V and −600 V, respectively. It is an advantageous feature of the invention that the bias is thus auto-referencing and auto-adjusting, since in some processes, the $V_{sb}$ can change during the process. Those skilled in the art will appreciate that the bias voltage could be asymmetric, if desired. For example, since the gas seal on the rim is a function of voltage, it may be advantageous in some applications to increase the voltage on the rim. Those skilled in the art will appreciate that the embodiment illustrated in FIG. 5 may be used to supply a plasma reference.

Additionally, in FIG. 6, there is illustrated another alternative in which the electrodes 100 and 200 are electrically decoupled. In this version, isolation ring 111, illustratively formed from alumina, boron nitride or any other insulator with relatively good thermal properties, has a vertical thickness sufficient to decouple the electrodes. For the 200 mm chuck illustrated, the capacitance between the electrodes is preferably less than 500 pf. The shape of ring 111 is not a simple ring, but has a higher portion on the inner radius. The reason for this extra-cost option is to reduce the capacitance between electrodes 100 and 200 to tailor the RF power distribution. In the version of FIG. 2, there would be two steps at the inner and outer edges of the ring because, in that version, electrode 200 has an interface with electrode 100 at the outer portion as well as at the inner portion of the chuck.

The radial gap between the electrodes should be relatively small, (0.020") in order to have strong fringing fields for a good grip on the workpiece, but a close gap increases the capacitance. The ring is not extended up to the surface because of the above constraint from the fringing fields and also because the thermal conductivity of ceramic is much less than that of aluminum, so that there would be a radial temperature discontinuity if the ceramic did extend up to the surface. Those skilled in the art will appreciate that the final dimensions will depend on the usual engineering tradeoffs, including the sensitivity of the process to radial differences in coupled RF power, differences in temperature and wafer clamping force. In the embodiment illustrated, ring 111 was 0.125 inch thick in the main portion and was 0.340 inch thick in the inner portion. The nominal thickness of electrode 100 at the inner radius was 0.125 inch.

Note that this embodiment lacks the outer rim 210 of the embodiment of FIG. 1, so that the gas feed groove 515 is in electrode 100. The embodiment also has a guard ring 300, similar to that shown in FIG. 5. A sensing electrode 310, as shown in FIG. 6, could also be used.

Figure 7:
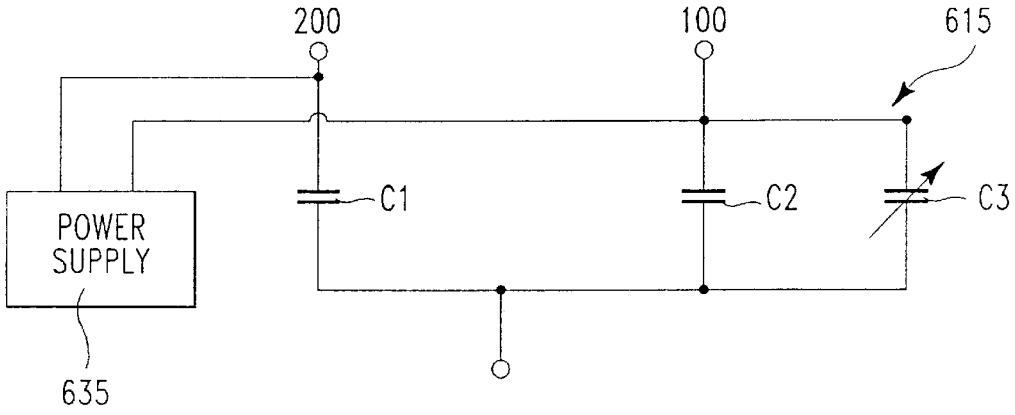
FIG. 7 illustrates an RF coupling circuit for use with the invention.

The box labeled 615 in FIG. 6 represents the coupling circuit illustrated in FIG. 7, in which DC power supply 635, isolated by RF chokes and capacitively shunted to ground in a conventional fashion, is connected to electrodes 100 and 200 in parallel with a capacitive coupler in which a small fixed capacitor C2 is in parallel with a variable capacitor C3 that is used to tune to compensate for radial variations in plasma generation caused by non-uniform fields reflecting the geometry of the chamber that affect the plasma above electrode 100 differently from that above electrode 200. There is a frequency-dependent conductivity of the wafer that implies that the system will work better at higher frequency.

In prior art chucks such as that illustrated in U.S. Pat. No. 4,554,611, the combination of dielectric and wafer was such that there was a significant decay time after the removal of a DC attracting voltage before the wafer could be removed since the very high voltages and dielectric materials used for early chucks caused mobile ions in the dielectric to be trapped polarizing the dielectric. The system described in U.S. Pat. No. 5,103,367 (Horwitz) uses AC drive on the attracting electrodes to alleviate the problem by returning the field to zero repeatedly, thus preventing the formation of a persistent polarization from mobile ions that may be present. If an AC drive were used with the present invention, the pressure of the cooling gas would pop the wafer off the chuck when the voltage dropped below the value that balances the force from the gas pressure. With a 200 mm wafer and a gas pressure of 10 Torr, the voltage required to balance the gas pressure is 200–300 V.

In a system according to the invention, retention of the clamping force is not a problem and there is far more concern with dielectric breakdown between the electrodes and the wafer. With the very thin dielectric used in the present invention, there is a fine balance between the thickness of the dielectric and the danger of breakdown. As is known, the clamping force is proportional to $(V/d)^2$, where V is the voltage and d is the dielectric thickness. Thus, if the thickness is doubled, so must the voltage, in order to maintain the same clamping force and there is no gain in breakdown resistance. It has been found, contrary to the teachings of the art, that the combination of RF voltage and clamping voltage can cause dielectric breakdown between the wafer and the electrode. This was not a problem in prior art systems that either used very high voltages with correspondingly strong dielectrics and if they used RF, did not feed the RF through the same insulating area as the clamping voltage.

Those skilled in the art will appreciate that the stress on the hard-coat insulation will be frequency-dependent, since there will be an RF voltage superimposed on the DC clamping voltage. In some applications, the RF voltage across the capacitance between the electrode and the wafer ($\alpha 1/\omega C$) together with the DC clamping voltage can exceed the breakdown voltage of the insulator. The danger of this is greatest for low frequency systems, such as the Lam system 4520, in which the plasma is driven at 400 Khz. For example, in a system according to the invention in which the capacitance between the base and the wafer is approximately 6,000 pf, an RF power signal of 400 KHz and a nominal RF current of 2–3 A will produce an RF voltage across the insulator of 200–400 V.

The Horwitz reference also teaches a preferred RF embodiment differing substantially from that of the present invention. In FIG. 8, it discloses thin film insulators as a preferred embodiment for RF applications. Nothing is taught about how the RF is fed through the chuck into the plasma, whether it is through direct contact with the electrodes or by capacitive coupling through the RF—reference electrode. In that system, also, the extensive area of the RF reference electrode outside the wafer means that the plasma will be driven more strongly outside the wafer than above it, which is a disadvantage that greatly increases corrosion of the RF reference electrode and interferes with the etching process.

Those skilled in the art will readily appreciate that different embodiments of the invention may be made in view of the enclosed teaching and the following claims are not meant to be limited to the embodiments disclosed.

We claim:

[1. An electrostatic chuck system for holding, in a vacuum ambient, by electrostatic attraction of a DC potential a workpiece having a workpiece radius comprising: at least two circularly symmetric, concentric conductive electrodes having a dielectric coating and together providing a planar clamping surface, at least one of said conductive electrodes having gas feed means therein, characterized in that:

an outer electrode of said at least two circularly symmetric, concentric conductive electrodes has an electrode outer radius less than said workpiece radius by a guard ring distance;

said outer electrode is surrounded by a conductive guard ring having a guard ring outer radius less than said workpiece radius by an overhang amount, having a guard ring top surface substantially coplanar with said planar clamping surface and being dielectrically isolated from and capacitively coupled to said outer electrode and to said workpiece, whereby said guard ring suppresses vacuum arcs between said workpiece and said outer electrode by establishing a equipotential area substantially equal in potential to said workpiece between said workpiece and said outer electrode.]

[2. A system according to claim 1, further characterized in that:

RF power is fed through said at least two conductive electrodes and coupled therefrom to said workpiece, said RF power being capacitively coupled to said guard ring and capacitively coupled therefrom to that portion of said workpiece having a radius greater than said electrode outer radius.]

[3. A system according to claim 2, further characterized in that: an annular dielectric field shaping ring is disposed radially outward from said guard ring and having a field shaping inner radius substantially equal to said guard ring outer radius, whereby said workpiece overlaps said annular dielectric field shaping ring.]

[4. A system according to claim 3, further characterized in that: one of said conductive electrodes has an annular form and is supported in a recess in the other of said conductive electrodes, said conductive electrodes having at least one interface therebetween;

RF power is connected directly to both said conductive electrodes and RF power is capacitively coupled to said guard ring from said outer electrode; and said conductive electrodes are decoupled by an annular dielectric member having a greater thickness in a radial region abutting said interface between said conductive electrodes.]

[5. A system according to claim 1, further characterized in that:

gas flows radially outward from a distribution groove in said top surface of said outer electrode and flows between said workpiece and said guard ring.]

[6. A system according to claim 5, further characterized in that:

RF power is fed through said at least two conductive electrodes and coupled therefrom to said workpiece, said RF power being capacitively coupled to said guard ring and capacitively coupled therefrom to that portion of said workpiece having a radius greater than said electrode outer radius.]

[7. A system according to claim 6, further characterized in that: an annular dielectric field shaping ring is disposed radially outward from said guard ring and having a field shaping inner radius substantially equal to said guard ring outer radius, whereby said workpiece overlaps said annular dielectric field shaping ring.]

[8. A system according to claim 7, further characterized in that: one of said conductive electrodes has an annular form and is supported in a recess in the other of said conductive electrodes, said conductive electrodes having at least one interface therebetween;

RF power is connected directly to both said conductive electrodes and RF power is capacitively coupled to said guard ring from said outer electrode; and said conductive electrodes are decoupled by an annular dielectric member having a greater thickness in a radial region abutting said interface between said conductive electrodes.]

[9. An electrostatic chuck system for holding, in a vacuum ambient, by electrostatic attraction of a DC potential a workpiece having a workpiece radius comprising: at least two circularly symmetric, concentric conductive electrodes having a dielectric coating and together providing a planar clamping surface, at least one of said conductive electrodes having gas feed means therein, characterized in that:

an outer electrode of said at least two circularly symmetric, concentric conductive electrodes has an electrode outer radius less than said workpiece radius by a guard ring distance;

said outer electrode is surrounded by a conductive guard ring having a guard ring outer radius less than said workpiece radius by an overhang amount, having a guard ring top surface substantially coplanar with said planar clamping surface and being dielectrically isolated from said outer electrode;

said conductive guard ring has at least one sensing pin extending therefrom and exposed to the plasma, thereby raising said guard ring to said plasma potential, whereby said guard ring suppresses vacuum arcs between said workpiece and said outer electrode by establishing a equipotential area substantially equal in potential to said plasma between said workpiece and said outer electrode.]

[10. A system according to claim 9, further characterized in that:

RF power is fed through said at least two conductive electrodes and coupled therefrom to said workpiece, said RF power being capacitively coupled to said guard ring and capacitively coupled therefrom to that portion of said workpiece having a radius greater than said electrode outer radius.]

[11. A system according to claim 10, further characterized in that: an annular dielectric field shaping ring is disposed radially outward from said guard ring and having a field shaping inner radius substantially equal to said guard ring outer radius, whereby said workpiece overlaps said annular dielectric field shaping ring.]

[12. A system according to claim 11, further characterized in that: one of said conductive electrodes has an annular form and is supported in a recess in the other of said conductive electrodes, said conductive electrodes having at least one interface therebetween;

RF power is connected directly to both said conductive electrodes and RF power is capacitively coupled to said guard ring from said outer electrode; and said conductive electrodes are decoupled by an annular dielectric member having a greater thickness in a radial region abutting said interface between said conductive electrodes.]

*13. An electrostatic chuck for holding, in a vacuum ambient, by electrostatic attraction of a DC potential a workpiece having a workpiece radius comprising: at least two circularly symmetric concentric conductive electrodes having a dielectric coating and together providing a planar clamping surface, at least one of said conductive electrodes having a gas feed means therein, characterized in that:*

*an outer electrode of said at least two circularly symmetric electrodes has a circular gas distribution groove in said top surface of said outer electrode, separated from an outer electrode radius by a radial impedance distance and connected to said gas feed means, whereby, in operation cooling gas enters said gas distribution groove and flows radially outward along said impedance distance between said workpiece and said top surface into said vacuum ambient, thereby establishing a cooling gas pressure within said gas distribution groove.*

*14. An electrostatic chuck according to claim 13, in which said vacuum ambient contains a plasma having a characteristic plasma potential and said outer electrode is surrounded by a conductive guard ring having a guard ring outer radius less than said workpiece radius by an overhand amount, having a guard ring top surface substantially coplanar with said planar clamping surface and being dielectrically isolated from and capacitively coupled to said outer electrode and to said workpiece, whereby said guard ring establishes an equipotential area substantially equal in potential to said workpiece between said workpiece and said outer electrode.*

*15. An electrostatic chuck according to claim 13, in which said vacuum ambient contains a plasma having a characteristic plasma potential and said chuck system includes bias means connected to said at least two electrodes for biasing said at least two electrodes with respect to said characteristic plasma potential.*

*16. An electrostatic chuck according to claim 15, in which one of said at least two electrodes is biased above said characteristic plasma potential and the other of said at least two electrodes is biased below said characteristic plasma potential.*

*17. An electrostatic chuck according to claim 16, in which a reference electrode exposed to said plasma is connected to a reference terminal of said bias means, whereby said at least two electrodes follow said characteristic plasma potential.*

*18. An electrostatic chuck for holding, by electrostatic attraction of a DC potential and in a vacuum ambient containing a plasma having a characteristic plasma potential, a workpiece having a workpiece radius comprising: at least two circularly symmetric concentric conductive electrodes having a dielectric coating and together providing a planar clamping surface, at least one of said conductive electrodes having a gas feed means therein, characterized in that:*

*said chuck system includes bias means connected to said at least two electrodes for biasing said at least two electrodes with respect to said characteristic plasma potential.*

*19. An electrostatic chuck according to claim 18, in which one of said at least two electrodes is biased above said characteristic plasma potential and the other of said at least two electrodes is biased below said characteristic plasma potential.*

*20. An electrostatic chuck according to claim 19, in which a reference electrode exposed to said plasma is connected to a reference terminal of said bias means, whereby said at least two electrodes follow said characteristic plasma potential.*

*21. An electrostatic chuck according to claim 20, in which*

*an outer electrode of said at least two circularly symmetric electrodes has a circular gas distribution groove in said top surface of said outer electrode, separated from an outer electrode radius by a radial impedance distance and connected to said gas feed means, whereby, in operation cooling gas enters said gas distribution groove and flows radially outward along said impedance distance between said workpiece and said top surface into said vacuum ambient, thereby establishing a cooling gas pressure within said gas distribution groove.*

*22. An electrostatic chuck according to claim 19, in which*

*an outer electrode of said at least two circularly symmetric electrodes has a circular gas distribution groove in said top surface of said outer electrode, separated from an outer electrode radius by a radial impedance distance and connected to said gas feed means, whereby, in operation cooling gas enters said gas distribution groove and flows radially outward along said impedance distance between said workpiece and said top surface into said vacuum ambient, thereby establishing a cooling gas pressure within said gas distribution groove.*

* * * * *